(12) United States Patent
Boyle

(10) Patent No.: US 6,841,482 B2
(45) Date of Patent: Jan. 11, 2005

(54) LASER MACHINING OF SEMICONDUCTOR MATERIALS

(75) Inventor: Adrian Boyle, Monasterevin (IE)

(73) Assignee: Xsil Technology Limited, Dublin (IE)

( * ) Notice: Subject to any disclaimer, the term of this patent is extended or adjusted under 35 U.S.C. 154(b) by 196 days.

(21) Appl. No.: 09/983,991

(22) Filed: Oct. 26, 2001

(65) Prior Publication Data

US 2002/0086544 A1 Jul. 4, 2002

(30) Foreign Application Priority Data

Dec. 15, 2000 (IE) .......................................... 2000/1021
Sep. 2, 2001 (EP) .......................................... 01650016

(51) Int. Cl.[7] .......................................... H01L 21/302
(52) U.S. Cl. .......................... 438/708; 438/662; 216/65
(58) Field of Search .............................. 438/662, 708, 438/709, 940; 219/121.6, 121.68, 121.67, 123.61; 216/62, 65, 66

(56) References Cited

U.S. PATENT DOCUMENTS

| | | | |
|---|---|---|---|
| 4,224,101 A | 9/1980 | Tijburg et al. .............. 156/643 |
| 4,958,900 A | 9/1990 | Ortiz, Jr. ................. 350/96.18 |
| 5,214,261 A | 5/1993 | Zappella ..................... 219/121 |
| 5,313,076 A | * 5/1994 | Yamazaki et al. ............ 257/66 |
| 5,811,751 A | 9/1998 | Leong et al. ............... 219/121 |
| 5,916,460 A | 6/1999 | Imoto et al. ................ 219/121 |
| 5,922,224 A | 7/1999 | Brockroelofs ............... 219/121 |
| 5,998,759 A | * 12/1999 | Smart .................... 219/121.69 |
| 6,031,201 A | * 2/2000 | Amako et al. ......... 219/121.68 |
| 6,509,548 B1 | * 1/2003 | Troitski ................. 219/121.69 |

FOREIGN PATENT DOCUMENTS

EP  0818818 A1  1/1998

* cited by examiner

Primary Examiner—Lan Vinh
(74) Attorney, Agent, or Firm—Timothy J Keefer; Seyfarth Shaw LLP

(57) ABSTRACT

A semiconductor is cut by directing a green laser beam of high power, and subsequently directing a UV beam along the cut line. The first beam performs cutting with relatively rough edges and a high material removal rate, and the second beam completes the cut at the edges for the required finish, with a lower material quantity removal.

12 Claims, 3 Drawing Sheets

LASER MACHINING OF SEMICONDUCTOR MATERIALS

FIELD OF THE INVENTION

The invention relates to the use of lasers in the machining of semiconductor materials or other materials having broadly similar properties. One example is machining of semiconductors for the purpose of singulating a single integrated circuit from an array of integrated circuits on a wafer. Another example is laser removal of semiconductor material for the purpose of defining apertures in the wafer or die.

PRIOR ART DISCUSSION

Integrated circuits are fabricated using wafers of semiconductor as the starting material. Multiple integrated circuits are manufactured simultaneously through multiple lithographic steps. One of the final stages in the integrated circuit manufacture is the singulation of the integrated circuit die from the wafer in which it is formed.

Currently, the industry uses diamond bladed high precision mechanical saws to perform this function. Although this is the accepted technique there are problems with the use of such saws as they cause chipping, debris generation and excessive thermal loading.

Although laser processing and the use of lasers in manufacturing is widespread, laser technology does not appear to have been applied successfully to the machining of semiconductor materials and other similar applications. The reasons for this are that the quality of the edge formed by a laser cutting process is not acceptable for precision applications such as integrated circuit manufacture. Also, the speed is inadequate for a high throughput production processes. Also, heat is often generated at the cut front, resulting in damage to the electrical function for which the component was manufactured.

U.S. Pat. No. 4,958,900 describes a holder for holding a plurality of optical fibers for illuminating a workpiece.

U.S. Pat. No. 5,922,224 describes a system for focusing light from a laser beam into two beams. As a semiconductor wafer is moved relative to the beams, the beams travel on the same path, one after the other.

The invention is directed towards providing for improved machining of semiconductor and like materials using laser beams. The desired improvements are in terms of machining rate and also quality and accuracy.

SUMMARY OF THE INVENTION

According to the invention, there is provided a method of machining a material comprising the steps of directing at least two laser beams at the material to perform a machining operation, characterized in that, the laser beams have different optical properties.

In one embodiment, the beams have different wavelengths, and the beam having longest wavelength is used initially and for the highest material removal rate, and a beam having a shorter wavelength is used subsequently to complete the machining operation.

In one embodiment, the beam having the longest wavelength also has the highest power.

In another embodiment, the beam having the longest wavelength comprises a pulse train having pulses at the fundamental or second harmonic laser frequency, and a beam having a shorter wavelength comprises a pulse train having pulses at the third, fourth, or fifth harmonic frequency.

In one embodiment, the highest power beam is generated from a solid state laser with a fundamental or second harmonic wavelength with a fundamental frequency in the near infra red spectral region and a second harmonic frequency in the visible to near infra-red range, and a shorter wavelength beam is generated with a wavelength in the ultraviolet range by generation of third, fourth, or fifth harmonic frequencies.

In another embodiment, the beams have a pulse width less than 300 nanoseconds.

In one embodiment, the beams each have a pulse repetition frequency of greater than 1 kHz.

In one embodiment, a galvanometer and an optical system deliver the beams, and an optical system provides a target transmission and beam size.

In one embodiment, the material is a wafer of semiconductor material.

In one embodiment, the material is a composite material comprising semiconductor material, and a dielectric material.

In a further embodiment, the longest wavelength beam is used to remove bulk semiconductor from one side along a cut line, and a shorter wavelength beam is used to remove a lower quantity of dielectric material from the opposite side along the cut line.

In one embodiment, the material is a semiconductor integrated circuit die, and the machining is performed around the edges of the die to singulate it from a wafer or an array of dies.

In one embodiment, the method comprises the further step of capturing an image of the material before cutting using a machine vision system and determining the cut line according to identified fiducials.

According to another aspect, the invention provides an apparatus for cutting a material, said apparatus comprising a laser source means, a laser beam guide means, and a controller comprising means for controlling the source means and the guide means to perform a machining operation, characterised in that the laser source means comprises a plurality of laser sources each for generating a laser beam having different optical properties, and the controller comprises means for controlling a machining operation in a method as described above.

DETAILED DESCRIPTION OF THE INVENTION

BRIEF DESCRIPTION OF THE DRAWINGS

The invention will be more clearly understood from the following description of some embodiments thereof, given by way of example only with reference to the accompanying drawings; in which.

DESCRIPTION OF THE EMBODIMENTS

Figure 1A:
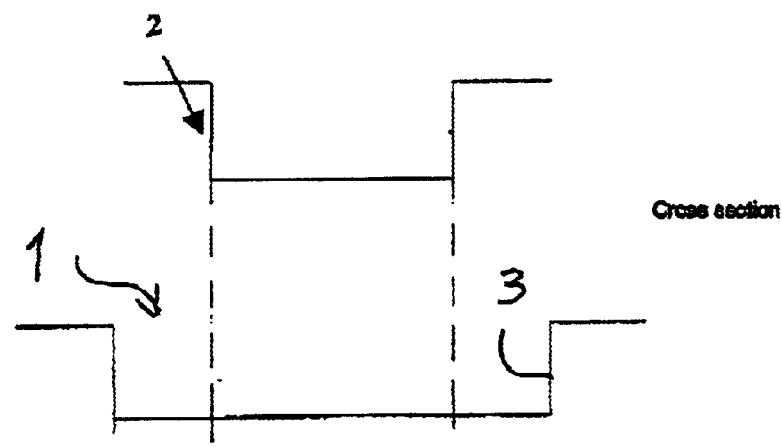
FIGS. 1(a) and 1(b) are diagrams illustrating use of two laser beams to machine a trench.

The invention provides a system and method for micro-machining semiconductor wafers by means of induced photo-ablation and other fundamental physical processes using two separate laser beams of different optical properties. The laser systems to generate the beams are diode pumped solid-state laser systems for example. (Nd: $YVO_4$@1064 nm) with first, second (532 nm), third (355 nm), fourth (266 nm) or fifth (213 nm) harmonic emissions. 1064 nm lasers provide high speed, 532 nm and 355 nm lasers provide high speed with moderate quality, and 266 nm and 213 nm systems provide best laser machining quality but low speed. Depending on the exact wavelength of the emission the harmonic wavelengths may also vary slightly (for example Nd: YAG).

The first beam preferable comprises a pulse train having pulses at the fundamental or second harmonic frequency. The second beam preferably comprises a pulse train having pulses in the third, fourth, or fifth harmonic frequencies.

For example, the first beam may be a Nd:YAG beam at a fundamental frequency of 1064 nm, or a second harmonic at 532 nm. The second beam may be a Nd:YAG third harmonic 355 nm beam.

It is preferred that both beams have a pulse width of less than 300 ns, and a pulse repetition frequency of greater than 1 kHz.

The system comprises two separate heads, the first employing an infra-red or visible wavelength laser (such as green) and the second employing a UV laser. The system comprises an accurate scanning and positioning system that involves a high resolution x-y stage and a two-axis galvanometer. A high-resolution two-camera imaging system is used for the accurate positioning of the wafer and the inspection of the micro-machined features. A topside vision system is used to provide positional information to a central processor. This vision system operates when the wafer is in the "artwork up" position. The topside vision system may be at a fixed offset to the laser beam positioning system, or the vision system may operate through the beam delivery path and focusing lens. The material handling system is designed to allow a wafer to be placed in the x-y table chuck with artwork facing upwards or downwards. A bottom side vision system is used to provide positional information for wafers with the artwork facing downward. The system also employs a handling robot, which loads the wafers and moves them from one head to the other.

The system also includes a gas blowing and debris extraction system. The debris extraction device ensures that debris does not land on fiducial locations so that accurate vision and alignment is possible. The air assist device ensures that debris is directed away from the machining front and, from the topside of the wafer, into a debris extraction system. The debris extraction and air assist also improve the machining speed and quality.

The system allows for complicated shapes, blind and cut-out, to be machined on both sides of semiconductor wafers at high speed.

In one embodiment, the first beam is a 1064 nm or 532 nm laser beam to achieve high machining speed and a high material removal rate, and the second beam is a 355 or 266 nm beam to achieve finish quality.

As described above, the laser machining system comprises two heads (Head 1 and Head 2) and a handling robot. Head 1 controls a pulsed green laser source of average power larger than 6 Watts, while Head 2 controls a pulsed 266 nm UV laser source of average power larger than 1.5 Watts. In both Head 1 and Head 2, the beam is delivered to the wafer using dielectric mirrors designed for the appropriate wavelength, laser power, polarisation and angle of incidence. A telescope is used to set the diameter of the beam at the input to the galvanometer. The beam is then directed into a two-axis galvanometer. Attached to the galvanometer is a telecentric, F-theta, flat field lens that delivers, uniformly, a focused beam to an area of up to 100 mm by 100 mm. In order to machine the whole area of the wafer, an x-y stage is used. This x-y stage incorporates a wafer holder. The x-y stage can be controlled to connect areas outside the galvanometer field of view to enable machining of long channels across the entire wafer. A handling robot is used to position the wafer in the x-y table with artwork facing upward or downward as required. This allows the wafer to be machined on both sides. The wafer holder is designed for a wafer of specific diameter. It can however be easily changed to accommodate wafers with smaller or larger diameters including 200 mm and 300 mm wafers.

All control systems, data systems, motion systems, vision systems and beam delivery are processor controlled.

The wafer is first machined by Head 1. Although the Head 1 green laser is effective at achieving material removal, the overall quality of the cut edge is lower than that achievable with a UV laser system. The quality of the interior cut section and the quality of the top surface are inferior to that obtainable with UV. However, the green lasers are of high power, are relatively low cost, and more stable. After the green laser in Head 1 has removed the bulk of material from a channel or trench, the UV laser in Head 2 can then be used to remove material from inside and from the edges of the trench with the effect that the net machining speed is improved, and there is excellent finish quality.

EXAMPLE 1

Figure 1B:
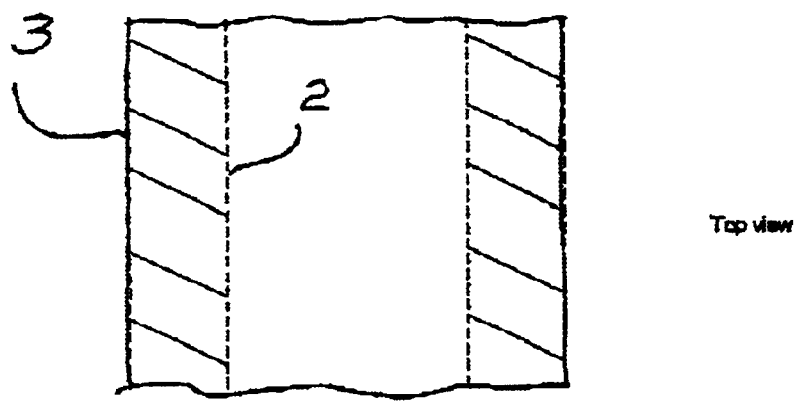

Machining a 700 μm Silicon Wafer with Two Laser Wavelengths in a Dual Headed System In this example a wafer is machined using a dual headed arrangement whereby the first head, Head 1 utilises a pulsed green laser source of average power larger than 6 Watts, while Head 2 utilises a pulsed 266 nm UV laser source of average power larger than 1.5 Watts. Reference is made to FIGS. 1(a) and 1(b).

The wafer is first machined by Head 1. Although the green laser is effective at achieving material removal, the overall quality of the cut edge is lower than that achievable with a UV laser system. The quality of the interior cut section and the quality of the top surface are inferior to that obtainable with UV. After the green laser of Head 1 has removed the bulk of material to form the profile 2, the UV laser of Head 2 is then used to remove material from inside and from the edges of the trench to provide the profile 3.

EXAMPLE 2

Figure 2A:
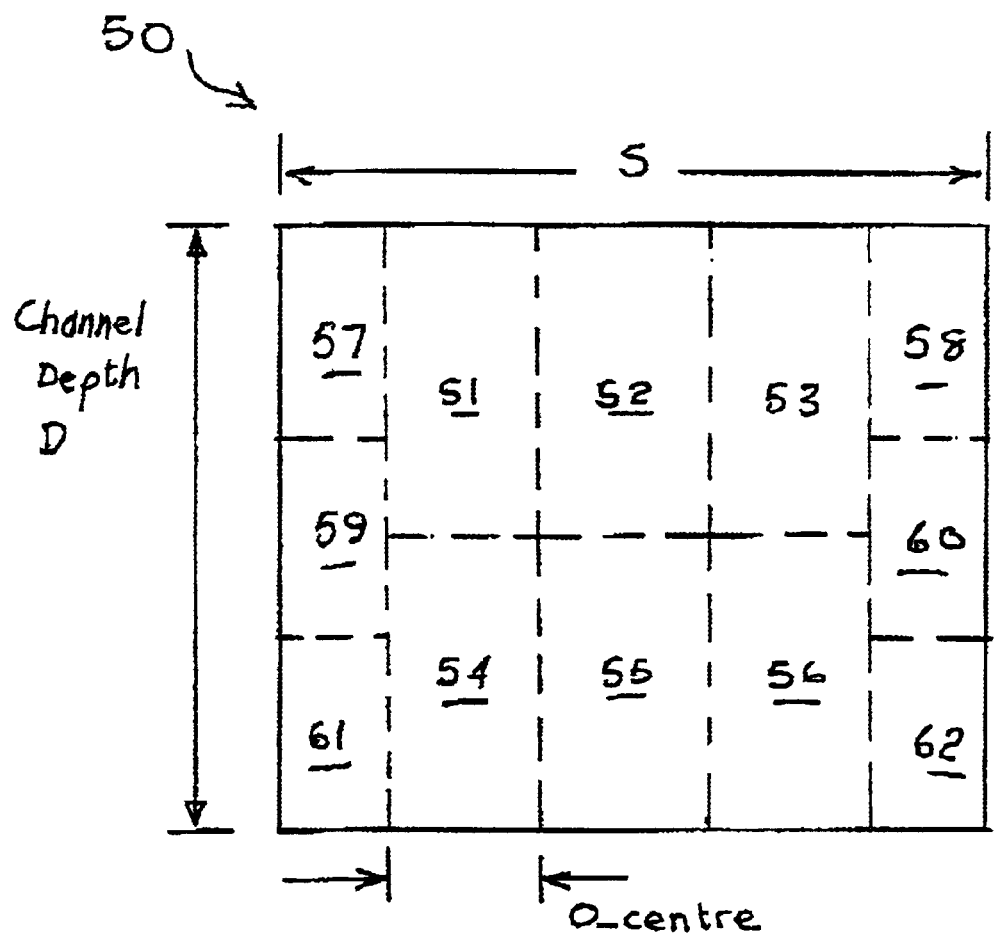
FIG. 2(a) is an idealised cross-sectional view showing a deep trench machined using two beams each in a succession of stages.
Figure 3A:
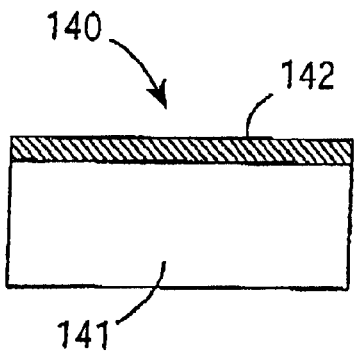
FIGS. 3(a), 3(b), 3(c) and 3(d) are a sequence of diagrams illustrating machining of a semiconductor wafer with a glass dielectric over-layer.
Figure 3B:
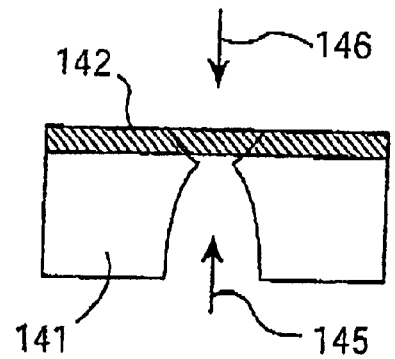
Figure 3C:
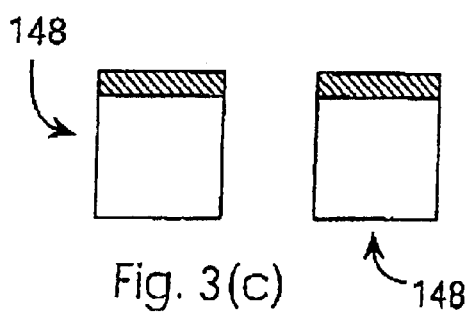
Figure 3D:
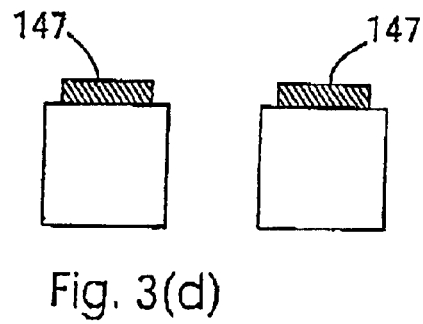
Figure 2B:
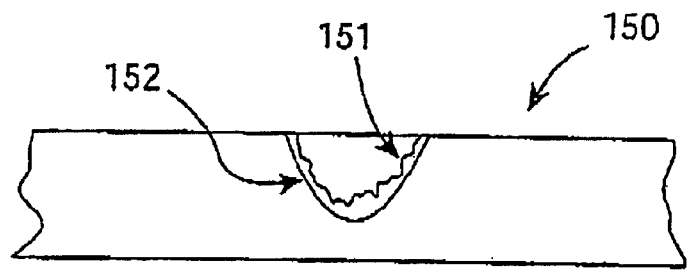
FIG. 2(b) is a diagrammatic cross-sectional view showing use of a UV laser beam to complete a quality finish to a roughly cut trench.

Machining a Deep Trench (FIG. 2)

Referring to FIG. 2(a) green and UV laser beams as described above for Example 1 are used to machine a deep trench 50 having a width S and a depth D.

In a first stage, a first scan of the green laser machines a rough sub-trench 51. Subsequent laterally offset scans of this laser beam machine sub-trenches 52 and 53. The lateral offset parameter is denoted "Ocenter".

In a second stage the green laser is used to machine in succession sub-trenches 54, 55, and 56 to achieve close to dull depth D (albeit with a rough finish).

The UV laser is then used to extend laterally the trench formed by the combined sub-trenches 51 to 56. In more detail, in a third stage the UV laser is scanned around the top edge to machine out rectangular volumes 57 and 58 to a depth of c. D/3. In a fourth stage the UV laser beam is scanned around in a rectangular path to remove the volumes 59 and 61 to a total depth of 2*D/3. Finally, in a fifth stage the UV beam is used to machine volumes 61 and 62 to complete an accurate and uniform profile for the trench 50, of the depth D and width S. The diagram of FIG. 2(*a*) is idealised, for clarity. Referring to FIG. 2(*b*) the manner in which the second beam operates is illustrated for a trench in a silicon wafer 150, in which roughness of the trench generated by the first laser is illustrated The cross section of the silicon wafer 150 is represented graphically in FIG. 2(*b*). A 10 W laser at 532 nm is initially used for high speed machining of the silicon substrate. The required trench depth and trench width S are achieved by suitable selection of the number of parallel scans (n) and the lateral offset between them ($O_{centre}$) for a given laser kerf width K. The values of n and $O_{centre}$ may be varied upon successive scans through the substrate material in order to machine the desired wall profile 151. Subsequently, a lower power UV laser beam is scanned over the trench in order to improve the trench cut quality and to reduce chipping and damage caused during machining with higher power 532 nm laser light 152. This multi-laser approach permits machining of a high quality trench in a silicon wafer substrate at a higher speed than that attainable solely through the use of a UV laser. Typical machining speeds for a 30 $\mu$m deep trench in silicon are >60 mm/s for a 10 W 532 nm laser. The speed of the finishing passes depends on the power and wavelength of the laser employed and these can be used to control the finish and texture of the final trench.

EXAMPLE 3

Machining a 700 $\mu$m Silicon Wafer with a 30 $\mu$m Quartz or Fused Silica Over Layer Referring to FIG. 3(*a*) a 700 micron wafer 140 with a silicon layer 141 of 670 microns and a 30 micron quartz or fused silica over layer 142, similar to that used in passive and active optical components, is represented graphically. A 9 W laser 145 at 532 nm is used for high speed machining of the silicon layer from the bottom side of the wafer, FIG. 3(*b*). Subsequently, a lower power UV laser beam 146 is used to accurately remove the quartz or fused silica layer 142 by machining from the top side of the wafer. This machining method is suited to the production of channels and also for dicing applications.

Straight wall cuts can be achieved by performing a number of laterally offset UV laser scans to cut beyond the quartz or fused silica layer and into the silicon substrate as shown in FIG. 3(*c*) to provide singulated die 148. Alternatively, the width of the trench S machined by the UV laser on the top side of the wafer can be increased relative to the trench width machined by the 532 nm laser from the bottom of the wafer, thus producing a step feature with a narrower over layer 147. This is shown in FIG. 3(*d*), in which two components have been diced in this way. Typical machining speeds for a straight wall channel lie in the region of 1.3 to 2.0 mm/s, depending on the required quality of finish, for a 10 W 532 nm and a 1.5 W 266 nm laser.

The invention is not limited to the embodiments described but may be varied in construction and detail.

What is claimed is:

1. A method of machining a material comprising the steps of directing at least two laser beams at the material to perform a machining operation, wherein the laser beams have different wavelengths, and a laser beam having a first wavelength is used initially and for the highest material removal rate, and a laser beam having a wavelength shorter than the first wavelength is used subsequently to complete the machining operation and wherein the beam having the first wavelength also has the highest power.

2. A method as claimed in claim 1, wherein the beam having the longest wavelength comprises a pulse train having pulses at the fundamental or second harmonic laser frequency, and the beam having a wavelength shorter than the first wavelength comprises a pulse train having pulses at the third, fourth, or fifth harmonic frequency.

3. A method as claimed in claim 1, wherein the highest power beam is generated from a solid state laser with a fundamental or second harmonic wavelength with a fundamental frequency in the near infra red spectral region and a second harmonic frequency in the visible to near infra-red range, and the beam having a wavelength shorter than the first wavelength is generated with a wavelength in the ultraviolet range by generation of third, fourth, or fifth harmonic frequencies.

4. A method as claimed in claim 1, wherein the beams have a pulse width less than 300 nanoseconds.

5. A method as claimed in claim 1, wherein the beams each have a pulse repetition frequency of greater than 1 kHz.

6. A method as claimed in claim 1, wherein a galvanometer and an optical system deliver the beams, and an optical system provides a target transmission and beam size.

7. A method as claimed in claim 1, wherein the material is a wafer of semiconductor material.

8. A method as claimed in claim 1, wherein the material is a semiconductor integrated circuit die, and the machining is performed around the edges of the die to singulate it from a wafer or an array of dies.

9. A method as claimed in claim 1, wherein the method comprises the further step, before cutting, of capturing an image of the material using a machine vision system and determining the cut line according to identified fiducials.

10. A method as claimed in claim 1, wherein the material is a composite material comprising semiconductor material, and a dielectric material.

11. A method as claimed in claim 10, wherein the first wavelength beam is used to remove bulk semiconductor from one side along a cut line, and the beam having a wavelength shorter than the first wavelength is used to remove a lower quantity of dielectric material from the opposite side along the cut line.

12. A method of machining a material comprising the steps of directing at least two laser beams at the material to perform a machining operation, characterized in that, the beams have different wavelengths, and the beam having longest wavelength is used initially and for the highest material removal rate, and a beam having a shorter wavelength is used subsequently to complete the machining operation;

the beam having the longest wavelength also has the highest power;

the beam having the longest wavelength comprises a pulse train having pulses at the fundamental or second harmonic laser frequency, and a beam having a shorter wavelength comprises a pulse train having pulses at the third, fourth, or fifth harmonic frequency; and the highest power beam is generated from a solid state laser with a fundamental or second harmonic wavelength with a fundamental frequency in the near infra red spectral region and a second harmonic frequency in the visible to near infra-red range, and a shorter wavelength beam is generated with a wavelength in the ultraviolet range by generation of third, fourth, or fifth harmonic frequencies.

* * * * *